(12) United States Patent
Calafiore et al.

(10) Patent No.: US 10,895,671 B1
(45) Date of Patent: Jan. 19, 2021

(54) DIFFRACTION GRATING WITH A VARIABLE REFRACTIVE INDEX USING ION IMPLANTATION

(71) Applicant: Facebook Technologies, LLC, Menlo Park, CA (US)

(72) Inventors: Giuseppe Calafiore, Redmond, WA (US); Austin Lane, Redmond, WA (US); Matthew E. Colburn, Woodinville, WA (US); Nihar Ranjan Mohanty, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 313 days.

(21) Appl. No.: 15/878,232

(22) Filed: Jan. 23, 2018

(51) Int. Cl.
*G02B 5/18* (2006.01)
*H01J 37/317* (2006.01)
*G02B 27/01* (2006.01)
*F21V 8/00* (2006.01)

(52) U.S. Cl.
CPC .......... *G02B 5/1857* (2013.01); *G02B 5/1828* (2013.01); *G02B 5/1866* (2013.01); *G02B 6/0035* (2013.01); *G02B 6/0065* (2013.01); *G02B 27/0172* (2013.01); *H01J 37/3171* (2013.01); *G02B 2027/0125* (2013.01)

(58) Field of Classification Search
CPC ............ G02B 27/0172; G02B 27/0018; G02B 3/0087; G02B 27/4205; G02B 2027/0178; G02B 27/4272; G02B 5/18; G02B 6/0016; G02B 2027/0174; G02B 27/0025; G02B 27/0103; G02B 27/017; G02B 5/1828; G02B 5/1842; G02B 5/1861; G02B 5/1866; B29D 11/00355; G02F 2201/30

See application file for complete search history.

(56) References Cited

U.S. PATENT DOCUMENTS

| | | |
|---|---|---|
| 4,196,246 A | 4/1980 | Takayama et al. |
| 4,934,788 A | 6/1990 | Southwell |
| 5,291,332 A | 3/1994 | Siebert |
| 5,428,635 A | 6/1995 | Zhiglinsky et al. |
| 5,498,444 A | 3/1996 | Hayes |
| 5,648,147 A | 7/1997 | Bischof et al. |
| 5,694,230 A | 12/1997 | Welch |
| 5,710,849 A | 1/1998 | Little et al. |
| 5,799,231 A | 8/1998 | Gates et al. |
| 5,876,902 A | 3/1999 | Veneklasen et al. |
| 5,982,545 A | 11/1999 | Su |
| 6,021,242 A | 2/2000 | Harumoto et al. |

(Continued)

OTHER PUBLICATIONS

U.S. Appl. No. 15/878,227, "Non-Final Office Action", dated Aug. 29, 2019, 14 pages.

(Continued)

*Primary Examiner* — Balram T Parbadia
(74) *Attorney, Agent, or Firm* — Weaver Austin Villeneuve & Sampson LLP

(57) ABSTRACT

Ion implantation is used to fabricate an optical device having a varying refractive index. The optical device can include a substrate with a material disposed on the substrate. A refractive index of the material is changed by ion implantation. The material can also be etched or imprinted. The optical device can be used in a virtual-reality system or augmented-reality system to provide angular selectivity from a display to a user's eye.

20 Claims, 13 Drawing Sheets

(56) References Cited

U.S. PATENT DOCUMENTS

| | | | |
|---|---|---|---|
| 6,172,792 B1 | 1/2001 | Jepsen et al. | |
| 6,671,452 B2 | 12/2003 | Winston et al. | |
| 6,734,436 B2 | 5/2004 | Faris et al. | |
| 6,816,648 B2* | 11/2004 | Goldstein | G02B 6/124 |
| | | | 359/566 |
| 7,876,504 B2 | 1/2011 | Vigier-Blanc et al. | |
| 8,168,373 B2 | 5/2012 | Shew | |
| 8,681,428 B1* | 3/2014 | Brown | G02B 1/002 |
| | | | 351/159.02 |
| 8,958,141 B1 | 2/2015 | Brown | |
| 8,975,601 B1 | 3/2015 | Chen | |
| 9,354,363 B2* | 5/2016 | Wu | G02B 5/18 |
| 9,378,926 B2 | 6/2016 | Kuo et al. | |
| 9,690,208 B2 | 6/2017 | Yu | |
| 10,288,775 B1 | 5/2019 | Keith et al. | |
| 2004/0091642 A1 | 5/2004 | Murakami et al. | |
| 2005/0046957 A1 | 3/2005 | Lai et al. | |
| 2005/0057815 A1 | 3/2005 | Lai et al. | |
| 2006/0029348 A1 | 2/2006 | Kempen et al. | |
| 2010/0002308 A1* | 1/2010 | Vigier-Blanc | H01L 31/02325 |
| | | | 359/654 |
| 2010/0079865 A1 | 4/2010 | Saarikko et al. | |
| 2010/0195204 A1 | 8/2010 | Walker | |
| 2010/0277803 A1 | 11/2010 | Pockett et al. | |
| 2010/0321781 A1 | 12/2010 | Levola et al. | |
| 2011/0159309 A1 | 6/2011 | Jiang et al. | |
| 2011/0274393 A1* | 11/2011 | Reed | G02B 6/12007 |
| | | | 385/37 |
| 2013/0032734 A1 | 2/2013 | Santori et al. | |
| 2013/0058370 A1 | 3/2013 | Chang-Hasnain et al. | |
| 2013/0155514 A1 | 6/2013 | Ushigome | |
| 2013/0321900 A1 | 12/2013 | Vallius et al. | |
| 2014/0300966 A1 | 10/2014 | Travers et al. | |
| 2015/0029584 A1 | 1/2015 | Song et al. | |
| 2015/0361286 A1 | 12/2015 | Williams | |
| 2018/0052276 A1 | 2/2018 | Klienman et al. | |

OTHER PUBLICATIONS

"Blazed grating", retrieved from https://en.wikipedia.org/wiki/Blazed_grating, Dec. 26, 2016 and printed on Feb. 10, 2017, 3 pages.

"Electron-beam lithography", retrieved from https://en.wikipedia.org/wiki/Electron-beam_lithography, Sep. 12, 2017 and printed on Feb. 10, 2017, 7 pages.

"Grayscale Lithography", retrieved from http://www.eng.auburn.edu/~sylee/gray.html, Sep. 30, 2017 and printed on Jan. 7, 2019, 1 page.

"Optical Components", retrieved from https://microdevices.jpl.nasa.gov/capabilities/optical-components/process-for-3-d-surface-relief-profiles.php and printed on Feb. 10, 2017, 6 pages.

"Stitch-free Lithography", retrieved from https://www.raith.com/technology/stitch-free-lithography.html, 2017 and printed on Feb. 10, 2017, 1 page.

Kirchner, et al., "ZEP520A—A resist for electron-beam grayscale lithography and thermal reflow", Microelectronic Engineering, vol. 153, Mar. 5, 2016, 3 pages.

Nist, "New Grayscale Technique Opens a Third Dimension for Nanoscale Lithography", retrieved from https://www.nist.gov/news-events/news/2013/08/new-grayscale-technique-opens-third-dimension-nanoscale-lithography, Aug. 28, 2013 and printed on Feb. 10, 2017, 3 pages.

Yu, et al., "The evaluation of photo/e-beam complementary grayscale lithography for high topography 3D structure", Proc. SPIE 8682, Advances in Resist Materials and Processing Technology XXX, 868212, retrieved from http://proceedings.spiedigitallibrary.org/proceeding.aspx?articleid=1674320, Mar. 29, 2013 and printed on Feb. 10, 2017, 3 pages.

"Ion Implantation", retrieved from https://matenggroup.wordpress.com/ion-implantation/ and printed on Nov. 6, 2018.

"Inkjet printing", retrieved from https://en.wikipedia.org/wiki/Inkjet_printing and printed on Nov. 6, 2018.

U.S. Appl. No. 15/878,227, "Final Office Action", dated Mar. 9, 2020, 16 pages.

U.S. Appl. No. 15/878,227, "Notice of Allowance", dated May 18, 2020, 10 pages.

U.S. Appl. No. 15/878,227, "Notice of Allowability", dated Jul. 1, 2020, 6 pages.

U.S. Appl. No. 15/878,227, "Notice of Allowability", dated Aug. 19, 2020, 6 pages.

U.S. Appl. No. 15/878,230, "Non-Final Office Action", dated May 15, 2020, 13 pages.

* cited by examiner

DIFFRACTION GRATING WITH A VARIABLE REFRACTIVE INDEX USING ION IMPLANTATION

CROSS-REFERENCES TO RELATED APPLICATIONS

The following three U.S. patent applications (including this one) are being filed concurrently, and the entire disclosure of the other applications are incorporated by reference into this application for all purposes:

application Ser. No. 15/878,227, filed Jan. 23, 2018, entitled "Diffraction Grating with a Variable Refractive Index Using Multiple Resins";

application Ser. No. 15/878,230, filed Jan. 23, 2018, entitled "Diffraction Grating with a Variable Refractive Index Formed Using an Energy Gradient"; and application Ser. No. 15/878,232, filed Jan. 23, 2018, entitled "Diffraction Grating with a Variable Refractive Index Using Ion Implantation."

BACKGROUND

The disclosure relates generally to near-eye-display systems, and more specifically to waveguide displays with a small form factor, a large field of view, and/or a large eyebox. Near-eye, light-field displays project images directly into a user's eye, encompassing both near-eye displays and electronic viewfinders. Conventional near-eye displays generally have a display element that generates image light that passes through one or more lenses before reaching a user's eyes. Additionally, near-eye displays in virtual-reality (VR) systems and/or augmented-reality (AR) systems have design criteria to be compact, be lightweight, and provide two-dimensional expansion with a large eyebox and a wide field-of-view (FOV). In typical near-eye displays, a limit for the FOV is based on satisfying two physical conditions: (1) an occurrence of total internal reflection of image light coupled into a waveguide, and (2) an existence of a first-order diffraction caused by a diffraction grating. Conventional methods used to satisfy the above two physical conditions rely on heavy and expensive components. Further, designing a conventional near-eye display with two-dimensional expansion involving two different output grating elements that are spatially separated often results in a large form factor. Accordingly, it is challenging to design near-eye displays using conventional methods to achieve a small form factor, a large FOV, and/or a large eyebox.

SUMMARY

The present disclosure relates generally to an optical device with a variable index of refraction. More specifically, and without limitation, this disclosure relates to an optical grating with a variable index of refraction. Ion implantation is used to create the varying refractive index. The ion implantation can occur before or after forming optical structures.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

This disclosure relates generally to diffraction gratings. More specifically, and without limitation, this disclosure relates to diffraction gratings in a virtual-reality and/or an augmented-reality system. An inkjet is used to fabricate a diffraction grating having a varying refractive index. The inkjet deposits drops of a first resin having a first refractive index and drops of a second resin having a second refractive index in a pattern on a substrate. The first resin and the second resin are mixed to form an optical device, such as a grating and/or an overcoat for a grating. The optical device has a refractive index that varies in one or two dimensions. The optical device is used in a virtual-reality system or augmented-reality system to provide angular selectivity from display to a user's eye.

Figure 1:
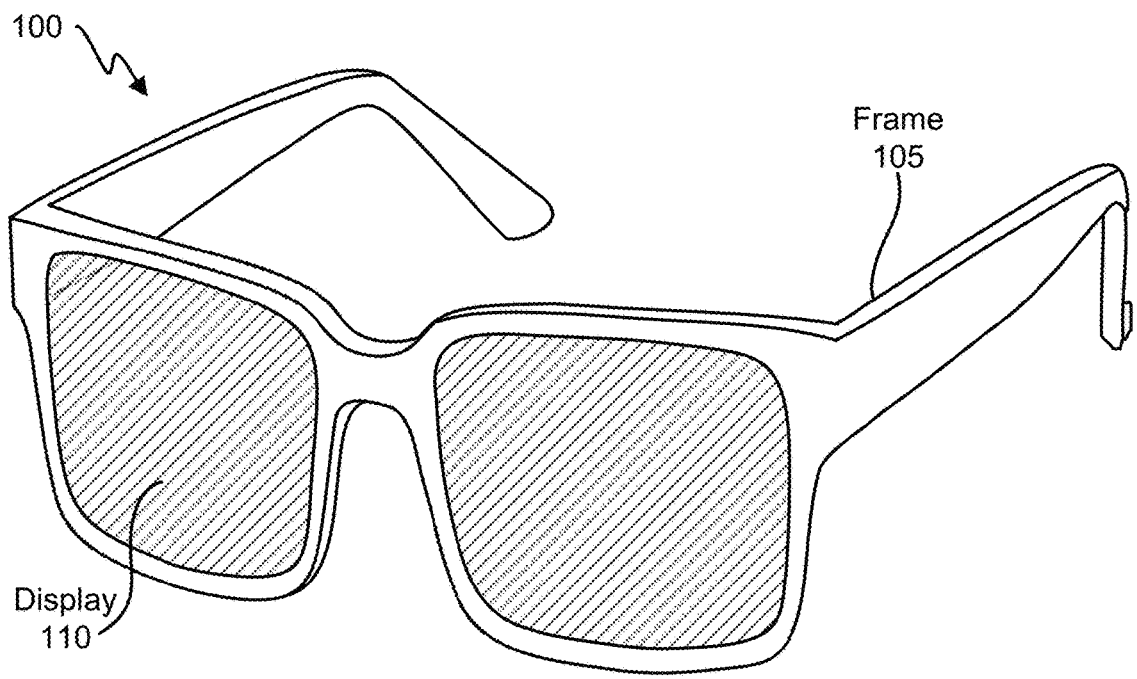
FIG. 1 is a diagram of an embodiment of a near-eye display.

FIG. 1 is a diagram of an embodiment of a near-eye display 100. The near-eye display 100 presents media to a user. Examples of media presented by the near-eye display 100 include one or more images, video, and/or audio. In some embodiments, audio is presented via an external device (e.g., speakers and/or headphones) that receives audio information from the near-eye display 100, a console, or both, and presents audio data based on the audio information. The near-eye display 100 is generally configured to operate as a virtual reality (VR) display. In some embodiments, the near-eye display 100 is modified to operate as an augmented reality (AR) display and/or a mixed reality (MR) display.

The near-eye display 100 includes a frame 105 and a display 110. The frame 105 is coupled to one or more optical elements. The display 110 is configured for the user to see content presented by the near-eye display 100. In some embodiments, the display 110 comprises a waveguide display assembly for directing light from one or more images to an eye of the user.

Figure 2:
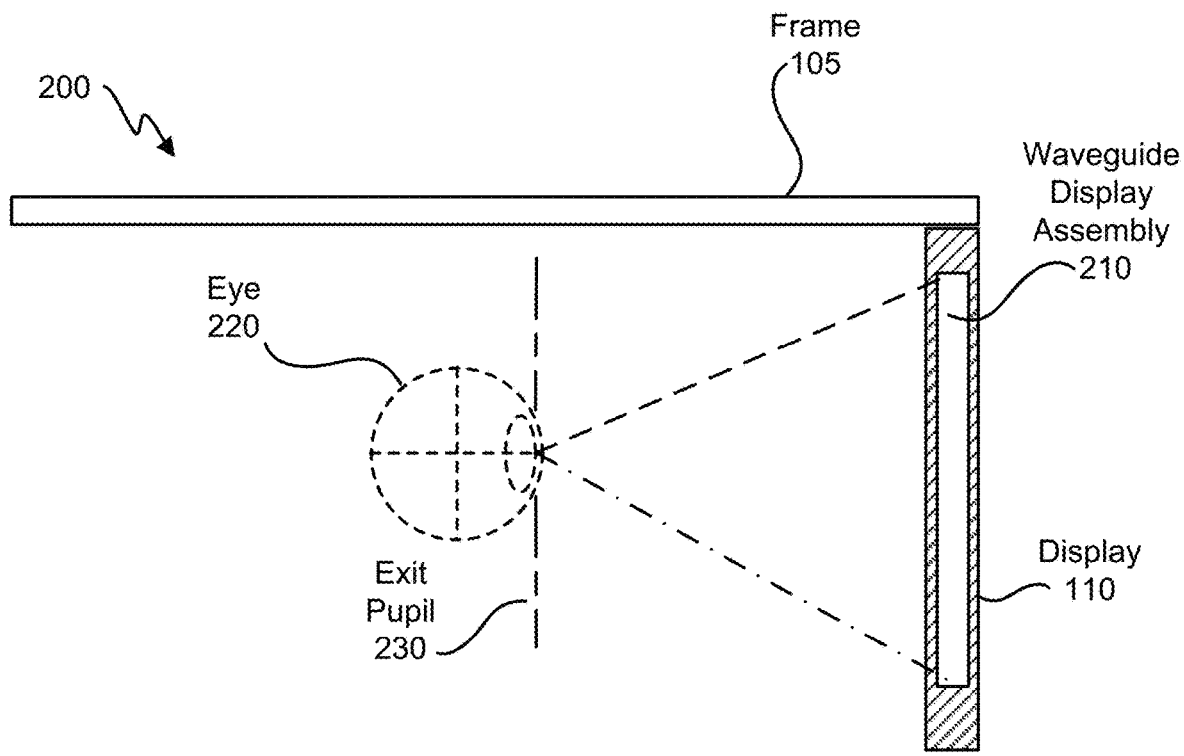
FIG. 2 is an embodiment of a cross section of the near-eye display.

FIG. 2 is an embodiment of a cross section 200 of the near-eye display 100 illustrated in FIG. 1. The display 110 includes at least one waveguide display assembly 210. An exit pupil 230 is a location where the eye 220 is positioned in an eyebox region when the user wears the near-eye display 100. For purposes of illustration, FIG. 2 shows the cross section 200 associated with a single eye 220 and a single waveguide display assembly 210, but a second waveguide display is used for a second eye of a user.

The waveguide display assembly 210 is configured to direct image light to an eyebox located at the exit pupil 230 and to the eye 220. The waveguide display assembly 210 may be composed of one or more materials (e.g., plastic, glass, etc.) with one or more refractive indices. In some embodiments, the near-eye display 100 includes one or more optical elements between the waveguide display assembly 210 and the eye 220.

In some embodiments, the waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g. multi-planar colored display). In some configurations, the stacked waveguide display is a monochromatic display that can be projected on multiple planes (e.g. multi-planar monochromatic display). The varifocal waveguide display is a display that can adjust a focal position of image light emitted from the waveguide display. In alternate embodiments, the waveguide display assembly 210 may include the stacked waveguide display and the varifocal waveguide display.

Figure 3:
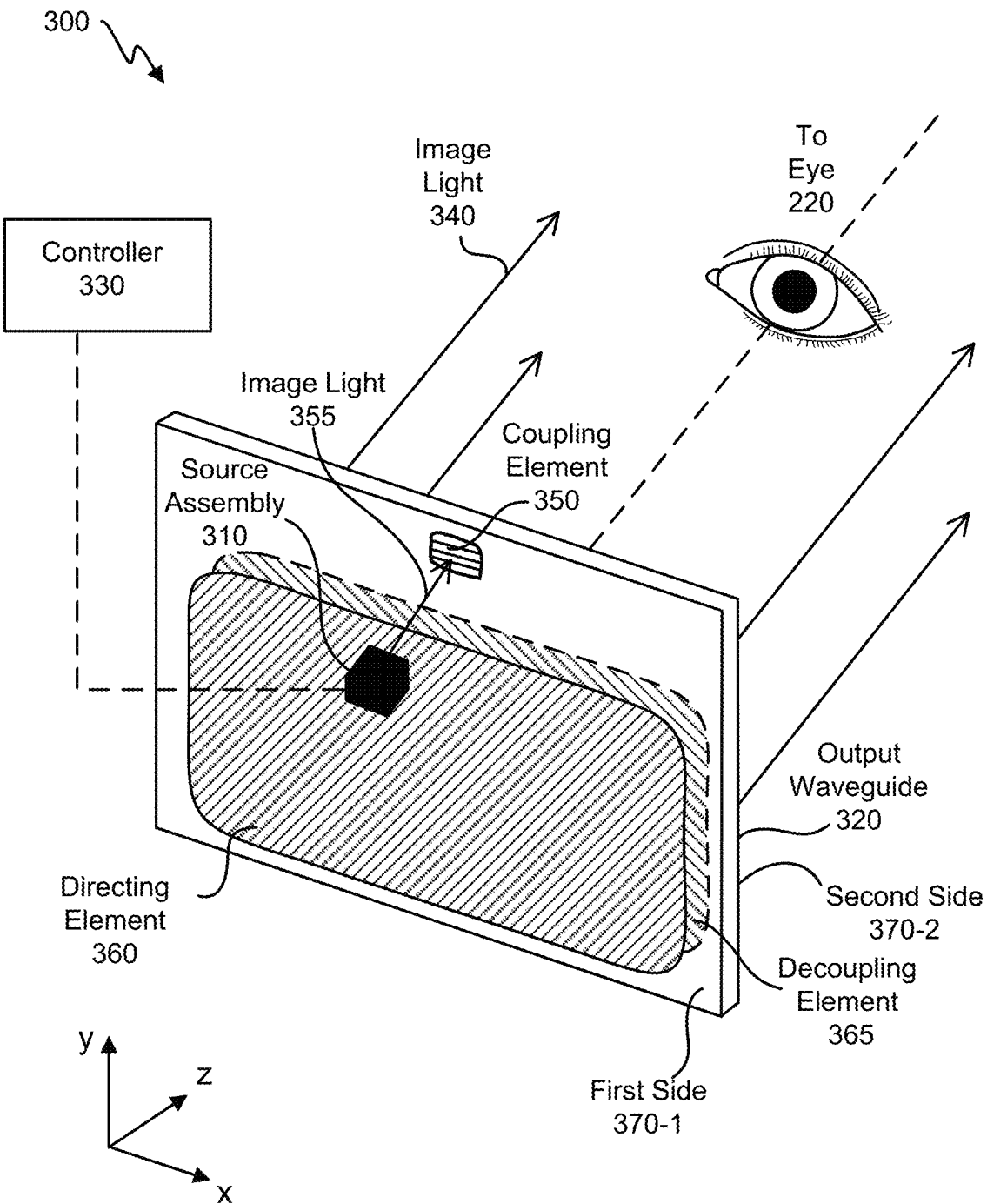
FIG. 3 illustrates an isometric view of an embodiment of a waveguide display with a single source assembly.

FIG. 3 illustrates an isometric view of an embodiment of a waveguide display 300. In some embodiments, the waveguide display 300 is a component (e.g., the waveguide display assembly 210) of the near-eye display 100. In some embodiments, the waveguide display 300 is part of some other near-eye display or other system that directs image light to a particular location.

The waveguide display 300 includes a source assembly 310, an output waveguide 320, and a controller 330. For purposes of illustration, FIG. 3 shows the waveguide display 300 associated with a single eye 220, but in some embodiments, another waveguide display separate, or partially separate, from the waveguide display 300 provides image light to another eye of the user.

The source assembly 310 generates image light 355. The source assembly 310 generates and outputs the image light 355 to a coupling element 350 located on a first side 370-1 of the output waveguide 320. The output waveguide 320 is an optical waveguide that outputs expanded image light 340 to an eye 220 of a user. The output waveguide 320 receives the image light 355 at one or more coupling elements 350 located on the first side 370-1 and guides received input image light 355 to a directing element 360. In some embodiments, the coupling element 350 couples the image light 355 from the source assembly 310 into the output waveguide 320. The coupling element 350 may be, e.g., a diffraction grating, a holographic grating, one or more cascaded reflectors, one or more prismatic surface elements, and/or an array of holographic reflectors.

The directing element 360 redirects the received input image light 355 to the decoupling element 365 such that the received input image light 355 is decoupled out of the output waveguide 320 via the decoupling element 365. The directing element 360 is part of, or affixed to, the first side 370-1 of the output waveguide 320. The decoupling element 365 is part of, or affixed to, the second side 370-2 of the output waveguide 320, such that the directing element 360 is opposed to the decoupling element 365. The directing element 360 and/or the decoupling element 365 may be, e.g., a diffraction grating, a holographic grating, one or more cascaded reflectors, one or more prismatic surface elements, and/or an array of holographic reflectors.

The second side 370-2 represents a plane along an x-dimension and a y-dimension. The output waveguide 320 may be composed of one or more materials that facilitate total internal reflection of the image light 355. The output waveguide 320 may be composed of e.g., silicon, plastic, glass, and/or polymers. The output waveguide 320 has a relatively small form factor. For example, the output waveguide 320 may be approximately 50 mm wide along x-dimension, 30 mm long along y-dimension and 0.5-1 mm thick along a z-dimension.

The controller 330 controls scanning operations of the source assembly 310. The controller 330 determines scanning instructions for the source assembly 310. In some embodiments, the output waveguide 320 outputs expanded image light 340 to the user's eye 220 with a large field of view (FOV). For example, the expanded image light 340 provided to the user's eye 220 with a diagonal FOV (in x and y) of 60 degrees and or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Figure 4:
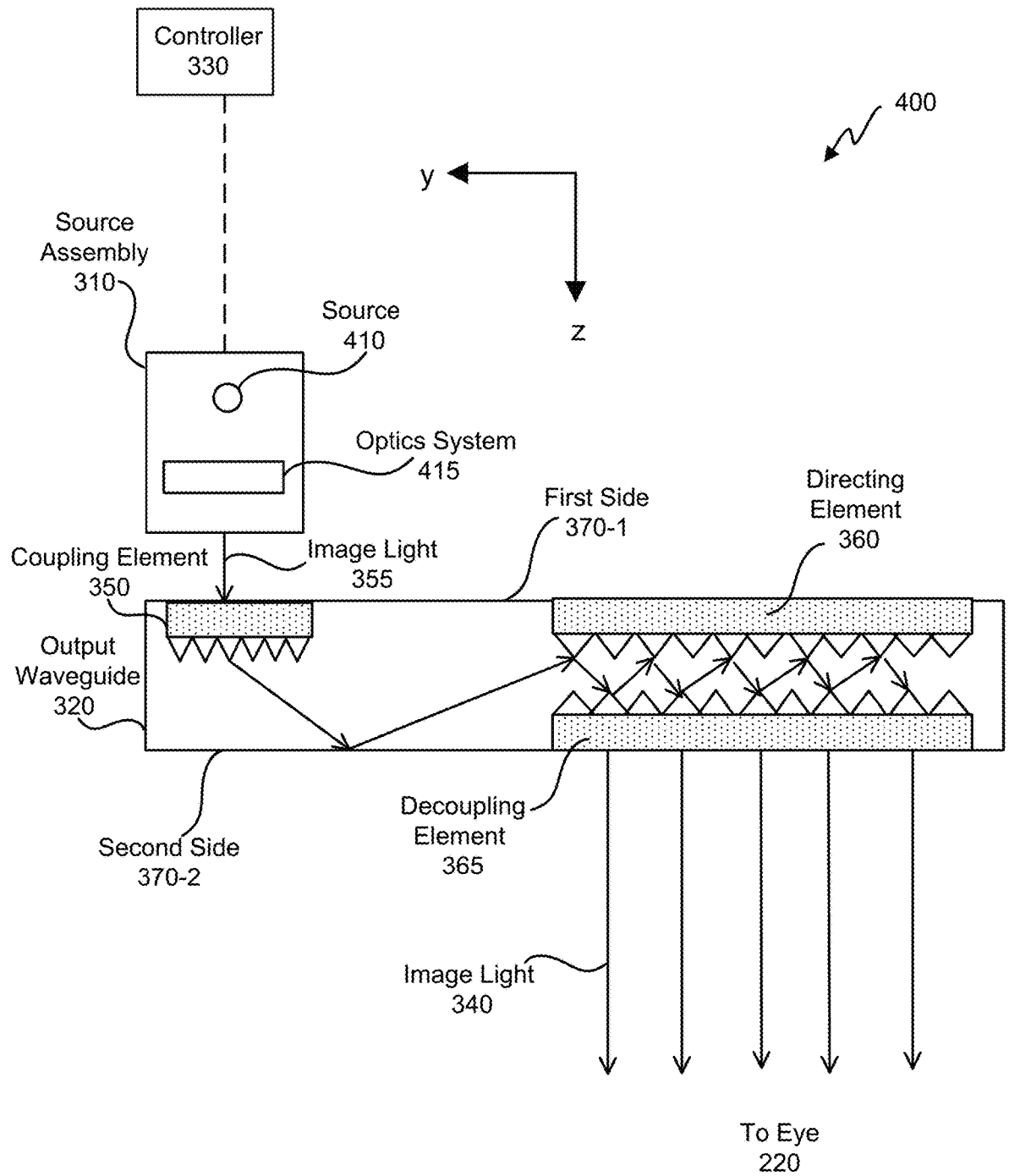
FIG. 4 illustrates a cross section of an embodiment of the waveguide display.

FIG. 4 illustrates an embodiment of a cross section 400 of the waveguide display 300. The cross section 400 includes the source assembly 310 and the output waveguide 320. The source assembly 310 generates image light 355 in accordance with scanning instructions from the controller 330. The source assembly 310 includes a source 410 and an optics system 415. The source 410 is a light source that generates coherent or partially coherent light. The source 410 may be, e.g., a laser diode, a vertical cavity surface emitting laser, and/or a light emitting diode.

The optics system 415 includes one or more optical components that condition the light from the source 410. Conditioning light from the source 410 may include, e.g., expanding, collimating, and/or adjusting orientation in accordance with instructions from the controller 330. The one or more optical components may include one or more lens, liquid lens, mirror, aperture, and/or grating. In some embodiments, the optics system 415 includes a liquid lens with a plurality of electrodes that allows scanning a beam of light with a threshold value of scanning angle to shift the beam of light to a region outside the liquid lens. Light emitted from the optics system 415 (and also the source assembly 310) is referred to as image light 355.

The output waveguide 320 receives the image light 355. The coupling element 350 couples the image light 355 from the source assembly 310 into the output waveguide 320. In embodiments where the coupling element 350 is diffraction grating, a pitch of the diffraction grating is chosen such that total internal reflection occurs in the output waveguide 320, and the image light 355 propagates internally in the output waveguide 320 (e.g., by total internal reflection), toward the decoupling element 365.

The directing element 360 redirects the image light 355 toward the decoupling element 365 for decoupling from the output waveguide 320. In embodiments where the directing element 360 is a diffraction grating, the pitch of the diffraction grating is chosen to cause incident image light 355 to exit the output waveguide 320 at angle(s) of inclination relative to a surface of the decoupling element 365.

In some embodiments, the directing element 360 and/or the decoupling element 365 are structurally similar. The expanded image light 340 exiting the output waveguide 320 is expanded along one or more dimensions (e.g., may be elongated along x-dimension). In some embodiments, the waveguide display 300 includes a plurality of source assemblies 310 and a plurality of output waveguides 320. Each of the source assemblies 310 emits a monochromatic image light of a specific band of wavelength corresponding to a primary color (e.g., red, green, or blue). Each of the output waveguides 320 may be stacked together with a distance of separation to output an expanded image light 340 that is multi-colored.

Figure 5:
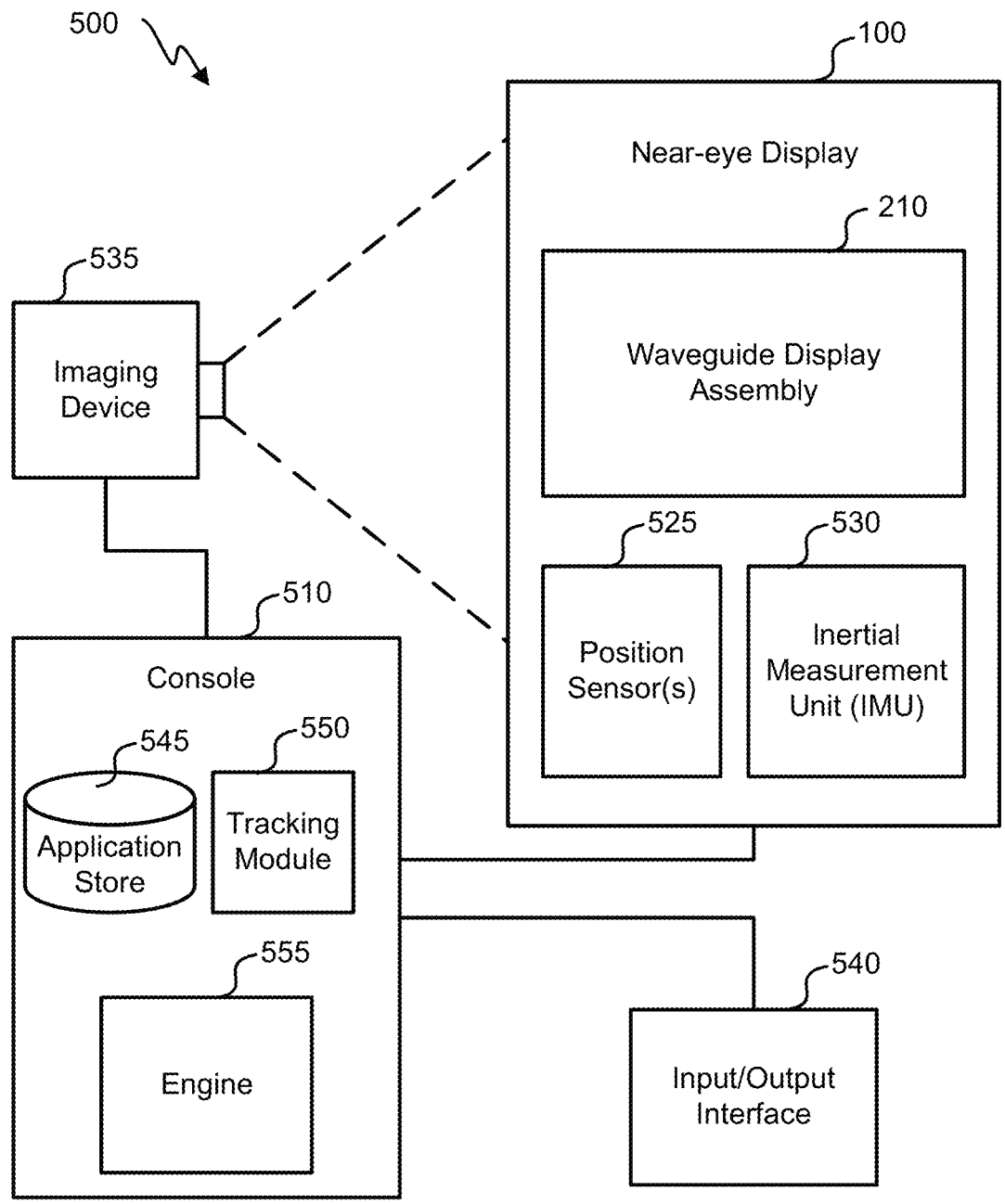
FIG. 5 is a block diagram of an embodiment of a system including the near-eye display.

FIG. 5 is a block diagram of an embodiment of a system 500 including the near-eye display 100. The system 500 comprises the near-eye display 100, an imaging device 535, and an input/output interface 540 that are each coupled to a console 510.

The near-eye display 100 is a display that presents media to a user. Examples of media presented by the near-eye display 100 include one or more images, video, and/or audio. In some embodiments, audio is presented via an external device (e.g., speakers and/or headphones) that receives audio information from the near-eye display 100 and/or the console 510 and presents audio data based on the audio information to a user. In some embodiments, the near-eye display 100 may also act as an AR eyewear glass. In some embodiments, the near-eye display 100 augments views of a physical, real-world environment, with computer-generated elements (e.g., images, video, sound, etc.).

The near-eye display 100 includes a waveguide display assembly 210, one or more position sensors 525, and/or an inertial measurement unit (IMU) 530. The waveguide display assembly 210 includes the source assembly 310, the output waveguide 320, and the controller 330.

The IMU 530 is an electronic device that generates fast calibration data indicating an estimated position of the near-eye display 100 relative to an initial position of the near-eye display 100 based on measurement signals received from one or more of the position sensors 525.

The imaging device 535 generates slow calibration data in accordance with calibration parameters received from the console 510. The imaging device 535 may include one or more cameras and/or one or more video cameras.

The input/output interface 540 is a device that allows a user to send action requests to the console 510. An action request is a request to perform a particular action. For example, an action request may be to start or end an application or to perform a particular action within the application.

The console 510 provides media to the near-eye display 100 for presentation to the user in accordance with information received from one or more of: the imaging device 535, the near-eye display 100, and the input/output interface 540. In the example shown in FIG. 5, the console 510 includes an application store 545, a tracking module 550, and an engine 555.

The application store 545 stores one or more applications for execution by the console 510. An application is a group of instructions, that when executed by a processor, generates content for presentation to the user. Examples of applications include: gaming applications, conferencing applications, video playback application, or other suitable applications.

The tracking module 550 calibrates the system 500 using one or more calibration parameters and may adjust one or more calibration parameters to reduce error in determination of the position of the near-eye display 100.

The tracking module 550 tracks movements of the near-eye display 100 using slow calibration information from the imaging device 535. The tracking module 550 also determines positions of a reference point of the near-eye display 100 using position information from the fast calibration information.

The engine 555 executes applications within the system 500 and receives position information, acceleration information, velocity information, and/or predicted future positions of the near-eye display 100 from the tracking module 550. In some embodiments, information received by the engine 555 may be used for producing a signal (e.g., display instructions) to the waveguide display assembly 210 that determines a type of content presented to the user.

Figure 6:
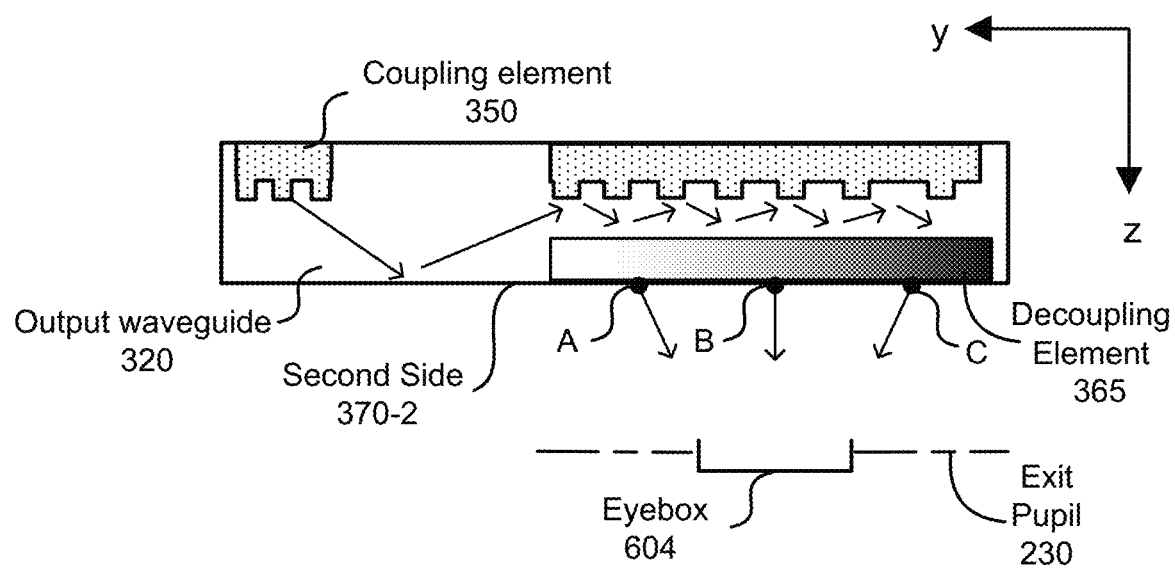
FIG. 6 illustrates an embodiment of an output coupler with angular selectivity.

FIG. 6 illustrates a cross section 600 of an embodiment of a waveguide display with angular selectivity. Angular selectivity addresses system-level efficiency. Cross section 600 includes the coupling element 350, the output waveguide 320, the decoupling element 365, and an eyebox 604, wherein the eyebox 604 is at the exit pupil 230. Light traveling from the coupling element 350 is transmitted through the output waveguide 320 and to the decoupling element 365. Light from the decoupling element 365 is selectively directed to the eyebox 604. The eyebox 604 is a usable area of light output from the decoupling element 365 at the exit pupil 230. In some embodiments, direction of light from the decoupling element 365 is not changed. In some embodiments, an intensity within a particular angular field of view is optimized. Gratings project light over a range of in-coupled angles. Extraction efficiency is increased for a particular field of view that hits the eyebox 604, thus minimizing light that cannot be seen by the eye. For example, light intensity distribution between modes of a grating is changed as a function of x and/or y so that more light is directed in a mode of the grating that is within the field of view of the eyebox 604.

Point A, point B, and point C are points along a plane of the decoupling element 365 where light is transmitted from the decoupling element 365 toward the eyebox 604. Point A is opposite point C. Point B is between point A and point C. The decoupling element 365 is a diffraction grating. The diffraction grating is configured to selectively change distribution of light emitted in modes of the diffraction grating. In FIG. 6, light from point A is primarily distributed in a mode directed down and to the right; light from point B is primarily distributed in a mode directed down (i.e., in a direction normal to the second side 370-2 of the output waveguide 320); and light from point C is primarily distributed in a mode directed down and to the left. Put another way, light from points A, B, and C can be defined by two vectors, a vector normal to the second side 370-2 and a lateral vector, wherein the lateral vector is orthogonal to the normal vector. The lateral vector of light from point A points in a direction opposite the lateral vector of light from point C; and a lateral vector of light from point B is zero (e.g., light from point B is in a direction of the normal vector of the second side 370-2). Thus light emitted from the decoupling element 365 is selectively directed to the eyebox 604 from point A, point B, and point C.

If light from the decoupling element 365 was not angularly directed, light from point A and/or point C would be transmitted in a direction parallel to light transmitted form point B (e.g., as shown in FIG. 4), and not as much light would enter the eyebox 604. Thus light from point B would appear brighter than light from point A and from point C. Thus if an image of a tree were centered in a field of view, a middle of a trunk of a tree might look bright, and leaves at a top of the tree and ground near a base of the tee (e.g., parts of a periphery of the image) might appear faded to a user. Parts of the periphery might appear faded because light intensity from pixels of the display 110 in the periphery (e.g., from point A and/or point C) would have less intensity reaching the eyebox 604 than light intensity from point B. For example, light from a first-order mode of a diffraction grating from points A and C would transmit parallel to a z-dimension and not selectively directed into the eyebox 604. In some embodiments, a lens is used to focus light from point A and/or point C into the eyebox 604. Yet a lens can be heavy to a user. Thus not using a lens, or using a thinner lens, improves a user's experience because the VR set is not as heavy.

In some embodiments, the decoupling element 365 is designed such that light from points between point A, point B, and/or point C are also selectively directed to the eyebox 604. In some embodiments, the output coupler (e.g., decoupling element 365) has a variable refractive index. In some embodiments, the decoupling element comprises a chirped grating (e.g., a grating with variable pitch).

In some embodiments, a system used for a virtual-reality and/or an augmented-reality display comprises: an optical source (e.g., source assembly 310); a waveguide (e.g., output waveguide 320); a coupling element (e.g., coupling element 350) configured to couple light from the optical source into the waveguide; and/or a decoupling element (e.g., decoupling element 365) configured to couple light out of the waveguide, wherein the decoupling element an optical element with a variable refractive index. The variable refractive index is configured to selectively direct light (e.g., modify light intensity) from the decoupling element 365 to the eyebox 604.

In some embodiments, an angular position of diffraction orders is defined by a period of a grating, wavelength of light, and/or a direction of incoming light. Shape, refractive index, height, and/or duty cycle of the grating do not change the angular position of the diffracted orders but can determine a distribution of energy in diffraction orders. To control a brightness, a uniformity, a field of view (FOV), and/or efficiency of an image projected to an eye of a user, design variables (e.g., grating period, wavelength of light, direction of incoming light, shape, refractive index, and/or duty cycle) of input and/or output diffraction gratings in a waveguide-based AR display can be controlled and/or varied across a pupil expander. In some embodiments, the output waveguide 320 is a planar waveguide (e.g., as opposed to a fiber-optic waveguide). In some embodiments, the device is defined by a length, and the refractive index gradient changes monotonically from high to low over the length of the device.

Figure 7:
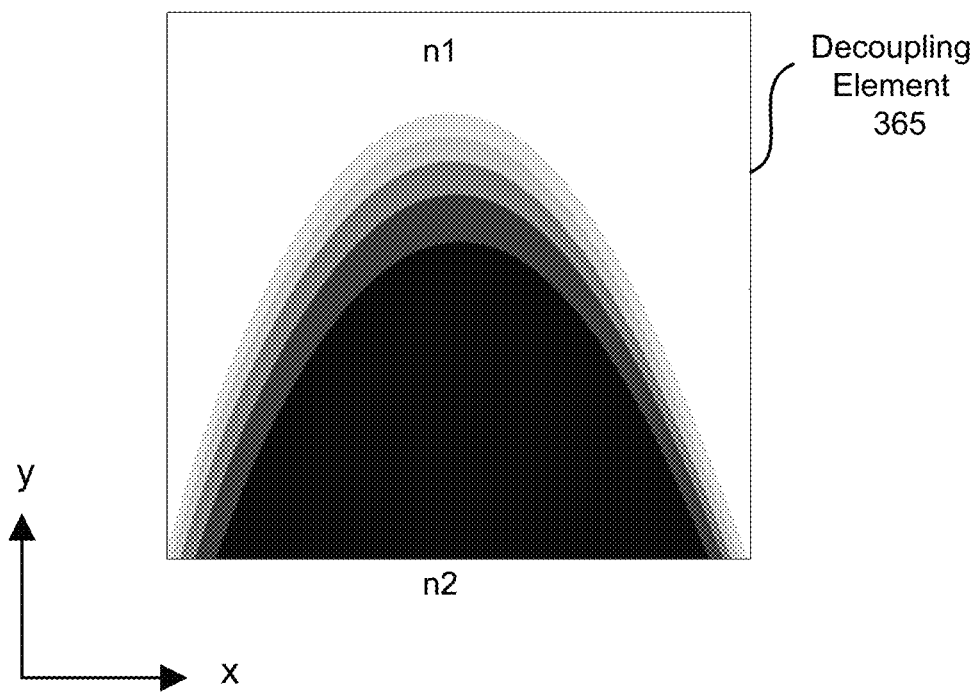
FIG. 7 illustrates a top view of a refractive-index profile of an embodiment of an optical device.

FIG. 7 illustrates a top view of a refractive-index profile of an embodiment of an optical device. The optical device is the decoupling element 365. The refractive index varies as a function of x and y. The function is a gradient along a parabolic-type curve. Other shapes for variable index could be created. In some embodiments, a device with a variable refractive index is created using an inkjet and depositing two or more types of resins on a structure (e.g., a grating and/or a substrate). In some embodiments, a first resin and a second resin are used. The first resin has a lower refractive index than the second resin. The inkjet deposits drops of the first resin on the structure and then deposits drops of the second resin on the structure to form a first pattern. A planarization step mixes drops of the first resin and drops of the second resin forming a second pattern of a variable refractive index, which is based on the first pattern.

Figure 8:
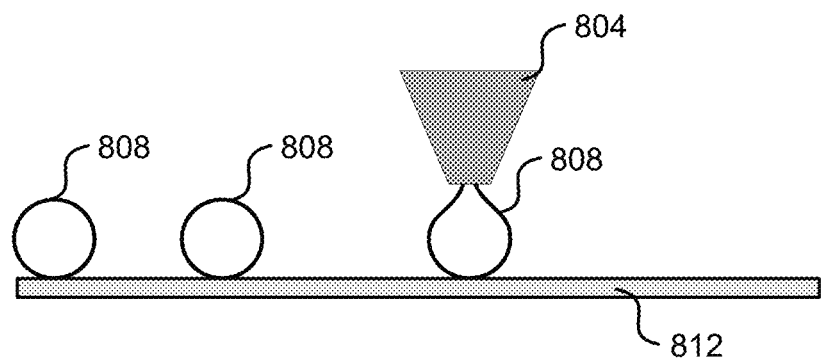
FIG. 8 is a simplified diagram of an embodiment of an inkjet depositing a first resin on a substrate.

FIG. 8 is a simplified diagram of an embodiment of a dispenser 804 depositing drops of a first material 808 on a substrate 812. The first material 808 has a first refractive index, n1. In some embodiments, the first material 808 is a resin, an imprint resin, a base resin, and/or a butyl-acrylate based resin. The first material 808 is deposited onto an imprint field. In some embodiments, drops of the first material have a diameter ranging between 5-200 µm, and/or 10-80 µm, e.g., 20, 30, 40, 50 and/or 60 µm+/−10% and/or +/−20%.

The dispenser 804 is part of an inkjet. The substrate 812 is flat (e.g., having a flat surface parallel to an x/y plane) and thin (e.g., a thickness measured in the z-dimension being less than half and/or a quarter of a length of the substrate 812 measured in the x-dimension). In some embodiments, the substrate is a semiconductor substrate (e.g., a silicon substrate).

Figure 9:
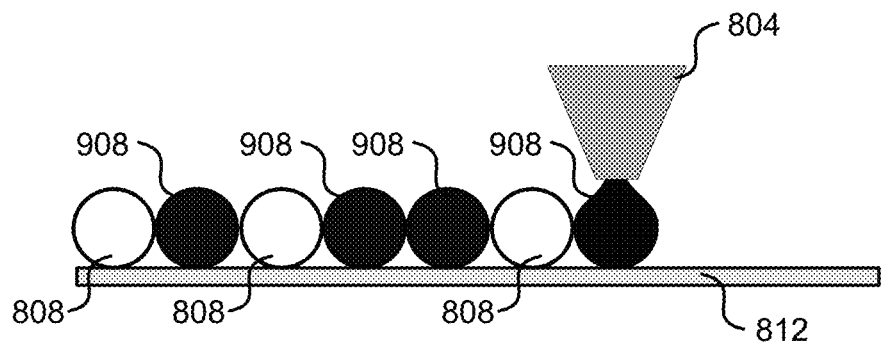
FIG. 9 is a simplified diagram of an embodiment of the inkjet depositing a second resin on the substrate.

FIG. 9 is a simplified diagram of an embodiment of the dispenser 804 depositing drops of a second material 908 on the substrate 812. The second material has a second refractive index, n2. The second refractive index n2 is greater than the first refractive index n1. The first material 808 is a base resin (e.g., butyl-acrylate based resin). The first material 808 is doped to create the second material 908. The dispenser 804 deposits drops of the first material 808 and drops of the second material 908 in a pattern in the same imprint field. The first material 808 is miscible with the second material 908. In some embodiments, the first material 808 has similar properties as the second material 908, such as viscosity, stiffness, drop size, and/or surface energy (e.g., within 5, 10, or 15% of each other) in order to be dispensed at the same time and/or imprinted at the same time. In some embodiments, surface energy/tension plays the largest role in two materials being able to be mixed. In some embodiments, the first material 808 and the second material 908 have somewhat different properties but are still printable using the dispenser 804. In some embodiments, the first material 808 and the second material 908 form a homogeneous mixture when added together. In some embodiments, the first material 808 is an imprint resin (e.g., a butyl acrylate based resin). The imprint resin is doped with a resin containing a sol-gel precursor, such as titanium butoxide, a monomer containing a reactive functional group for subsequent infusion processes (such as acrylic acid), and/or high refractive index nanoparticles (e.g., $TiO_2$, GaP, $HfO_2$, GaAs, etc.) to form the second material 908. In some embodiments, the base resin is doped to get the first material 808 and the base resin is doped to get the second material 908.

A refractive index difference, Δn, is equal to n2 minus n1. In some embodiments, doping a resin with a sol-gel precursor can achieve a refractive index difference Δn=0.5±3, 5, and/or 10%. In some embodiments, drops of the second material 908 are put on drops of the first material 808 (e.g., drop spacing center to center is less than drop diameter). In some embodiments, drops of the first material 808 are placed on drops of the first material 808 and/or drops of the second material 908 are placed on drops of the second material 908. The pattern of drops varies in two dimensions (e.g., FIG. 7). Drops of material are configured to blend so that refractive index changes smoothly. In some embodiments, drops mix on the spot (e.g., before FIG. 10 to generate certain ratios). In some embodiments, drops of a third material, a fourth material, a fifth material, and/or more materials, having different refractive indices are used.

Figure 10:
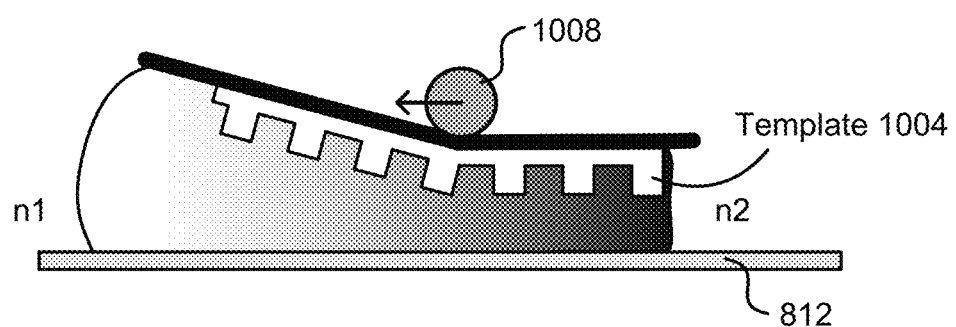
FIG. 10 is a simplified diagram of an embodiment of imprinting resins, after mixing the first resin and the second resin, to form a grating having a variable refractive index.

FIG. 10 is a simplified diagram of an embodiment of imprinting resins, after mixing the first resin and the second resin, to form a grating having a variable refractive index. After dispensing the first material 808 and the second material 908, the first material 808 and the second material 908 are imprinted and/or cured (e.g., crosslinked using heat and/or ultra-violet (UV) light). A template 1004 is used to imprint the first material 808 and the second material 908. In some embodiments, properties of the first material 808 and the second material 908 are chosen so that the same mold is used for both the first material 808 and the second material 908 at the same time. Thus the first material 808 could have different properties than the second material 908 within a given range of allowable printable properties. In some embodiments, the first material 808 is mixed with the second material 908 to form a continuous change in the refractive index (e.g., so that there are not sharp changes in the refractive index of a structure). In some embodiments, a roller 1008 is used to press the template 1004 on the first material 808 and the second material 908.

A residual layer is excess material between the substrate 812 and the template 1004. In some embodiments, the pattern of drops is configured to reduce the residual layer (e.g., by increasing drop spacing and/or decreasing pattern density of drops, where drop spacing is measured from a center of a first drop to a center of a neighboring drop). Thus an amount of resin can be increased or decreased and/or different mold densities can be made. After imprinting, the first material 808 and/or the second material 908 are cured. After curing, the first material 808 and the second material 908 form an optical device. In some embodiments, the optical device is a grating (e.g., a diffraction grating).

In some embodiments, the optical device is used for the coupling element 350, the directing element 360, and/or the decoupling element 365. The optical structure has a varying refractive index from a high refractive index n2 to a low refractive index n1. In some embodiments, Δn is between 0.05 and 0.6, e.g., 0.1, 0.2, 0.3, 0.4 and/or 0.5. In some embodiments, Δn is greater than 0.6. In some embodiments, a hard mold and/or soft mold covers the optical device.

Figure 11:
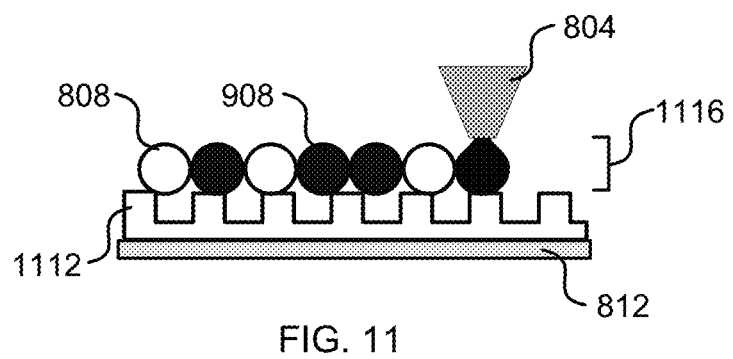
FIG. 11 is a simplified diagram of an embodiment of an inkjet depositing a first resin and a second resin on a grating to form a layer on the grating.

FIG. 11 is a simplified diagram of an embodiment of an inkjet depositing a first resin and a second resin on a grating 1112 to form a layer on the grating. Drops of the first material 808 and drops of the second material 908 are deposited on the grating 1112 by the dispenser 804 to form a pattern on the grating 1112. The drops of the first material 808 and drops of the second material 908 for a layer 1116 on the grating. Depositing resins on the grating 1112 is similar to depositing resins on the substrate 812.

Figure 12:
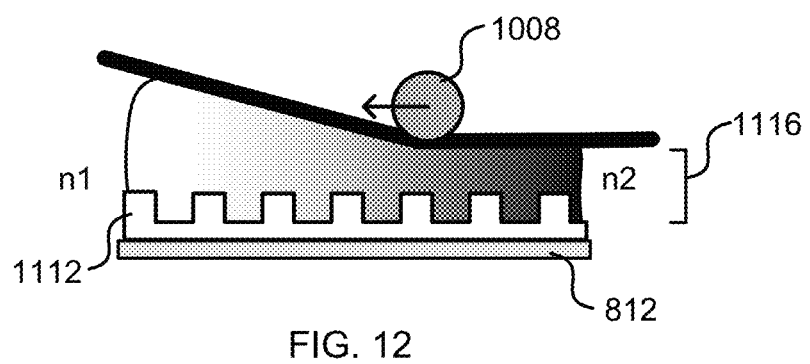
FIG. 12 is a simplified diagram of an embodiment of planarization of the layer on the grating.

FIG. 12 is a simplified diagram of an embodiment of planarization of the layer 1116 on the grating 1112. Planarization of layer 1116 is performed using roller 1008. Planarization of layer 1116 is similar to mixing materials as described in FIG. 10, except the template 1004 is not used since the grating 1112 is already formed.

Figure 13:
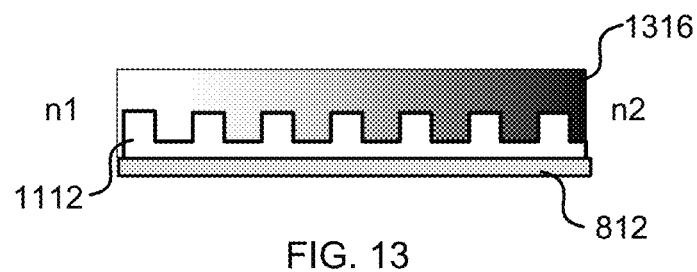
FIG. 13 is a simplified diagram of a grating having an overcoat, wherein the overcoat has a variable refractive index.

FIG. 13 is a simplified diagram of the grating 1112 having an overcoat 1316, wherein the overcoat 1312 has a variable refractive index. The refractive index of the overcoat 1316 varies from n1 to n2. In some embodiments, the overcoat 1316 is formed by demolding. In some embodiments, the layer 1116 is cured (e.g., by heat and/or light) after planarization of the layer 1116. The layer 1116 becomes the overcoat 1316 of the grating 1112.

Figure 14:
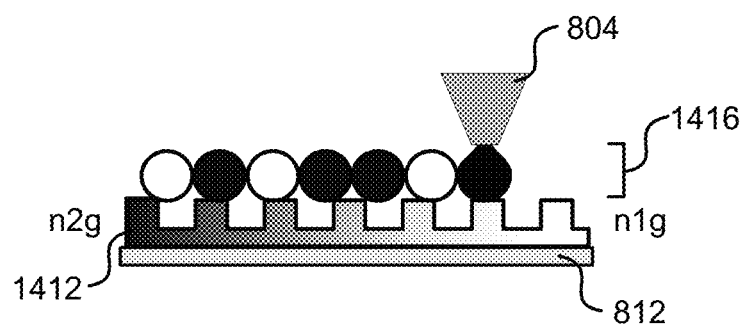
FIG. 14 is a simplified diagram of an embodiment of an inkjet depositing a first resin and a second resin on a grating to form a layer on the grating, wherein the grating has a variable refractive index.
Figure 15:
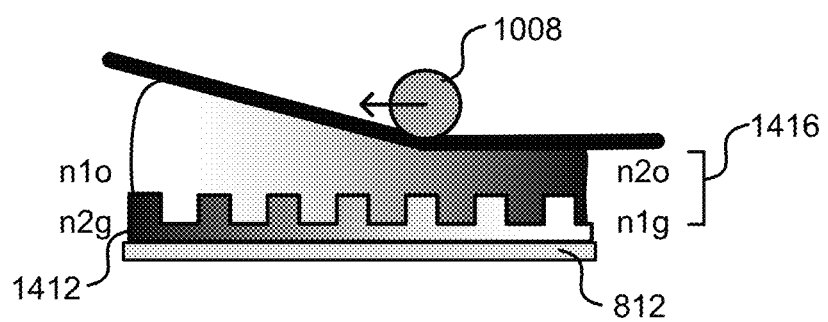
FIG. 15 is a simplified diagram of an embodiment planarization of the layer on the grating that has a variable refractive index.
Figure 16:
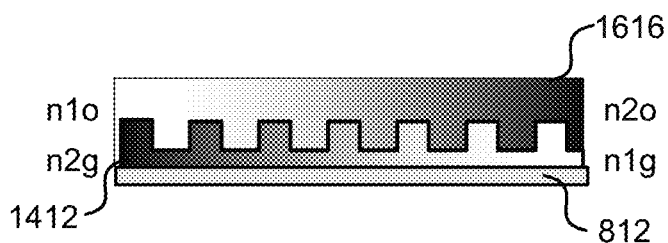
FIG. 16 is a simplified diagram of a grating having an overcoat, wherein the overcoat has a variable refractive index and the grating has a variable refractive index.

FIG. 14, FIG. 15, and FIG. 16 are similar to FIG. 11, FIG. 12, and FIG. 13, respectfully, except a grating 1412 with a variable index is used instead of grating 1112.

FIG. 14 is a simplified diagram of an embodiment of an inkjet depositing a first resin and a second resin on a grating 1412 to form a layer 1416 on the grating 1412, wherein the grating 1412 has a variable refractive index. The grating 1412 is defined by a high refractive index n2g and a low refractive index n1g. In some embodiments, the grating is formed as described in FIGS. 8-10. The dispenser 804 deposits drops of the first material 808 and drops of the second material 908 on the grating 1412. In some embodiments, different composition of resin drops are used than drops used in FIGS. 8-10 (e.g., for different curing). Resin fills trenches of the grating 1412 to form on overcoat with a refractive index gradient opposite that of the grating 1412 (e.g., for higher angle selectivity).

FIG. 15 is a simplified diagram of an embodiment of planarization of the layer 1416 on the grating 1412 that has a variable refractive index. Planarization of layer 1416 is performed using roller 1008. Planarization of layer 1416 is similar to mixing materials as described in FIG. 12. The layer 1416 has a high refractive index n2o and a low refractive index n1o. The refractive index of the layer 1416 is opposite the refractive index of the grating 1412. In FIG. 15, the high refractive index n2g of the grating 1412 and the low refractive index n1o of the layer 1416 are on a left side of the drawing and the low refractive index n1g of the grating 1412 and the high refractive index n2o of the layer 1416 are on a right side of the figure.

FIG. 16 is a simplified diagram of a grating having an overcoat 1616, wherein the overcoat 1616 has a first variable refractive index and the grating 1412 has a second variable refractive index. Having two different variations in refractive index allow for larger index difference between the overcoat 1616 and the grating 1412 for a larger beam change. The grating 1412 has a first refractive index gradient in a first direction (e.g., from right to left going from low to high) and the overcoat 1616 has a second refractive index gradient in a second direction (e.g., from left to right going from low to high). Both the first refractive index gradient and the second refractive index gradient are monotonic functions. The first direction is not the same as the second direction. The first direction is opposite the second direction.

In some embodiments, an optical device used in a virtual reality and/or an augmented-reality system comprises a substrate (e.g., substrate 812); a grating (e.g., grating 1112 and/or grating 1412) on the substrate; and an overcoat (e.g., overcoat 1316 and/or overcoat 1616) on the grating, wherein: the grating is made of a material with a varying refractive index, and/or the overcoat is made of a material with a varying refractive index. In some embodiments, a maximum refractive index of the material minus a minimum refractive index of the material is equal to or greater than 0.1 and/or equal to or less than 0.5, and/or equal to or greater than 0.5 and/or equal to or less than 1.5; the grating and/or the overcoat comprise a cured butyl-acrylate based resin; the overcoat has a first direction of increasing refractive index, the grating has a second direction of increasing refractive index, and the first direction is opposite the second direction; the material with the varying refractive index has an index of refraction that varies in two dimensions; resins, gratings, and/or overcoats are transparent to visible light; and/or the material with the varying refractive index comprises acrylic acid, $TiO_2$, GaP, and/or $HfO_2$.

In some embodiments, a system used in a virtual reality and/or an augmented-reality system comprises an optical source (e.g., source 410); a waveguide (e.g., output waveguide 320); an optical coupler (e.g., coupling element 350) configured to couple light from the optical source into the waveguide; an output coupler (e.g., decoupling element 365) configured to couple light out of the waveguide, the output coupler comprising: a grating (e.g., grating 1112 or grating 1412); and/or an overcoat (e.g., overcoat 1316 or overcoat 1616) of the grating, wherein the overcoat has a varying refractive index. In some embodiments, the output coupler further comprises a substrate (e.g., substrate 812) and the grating is disposed on the substrate.

Figure 17:
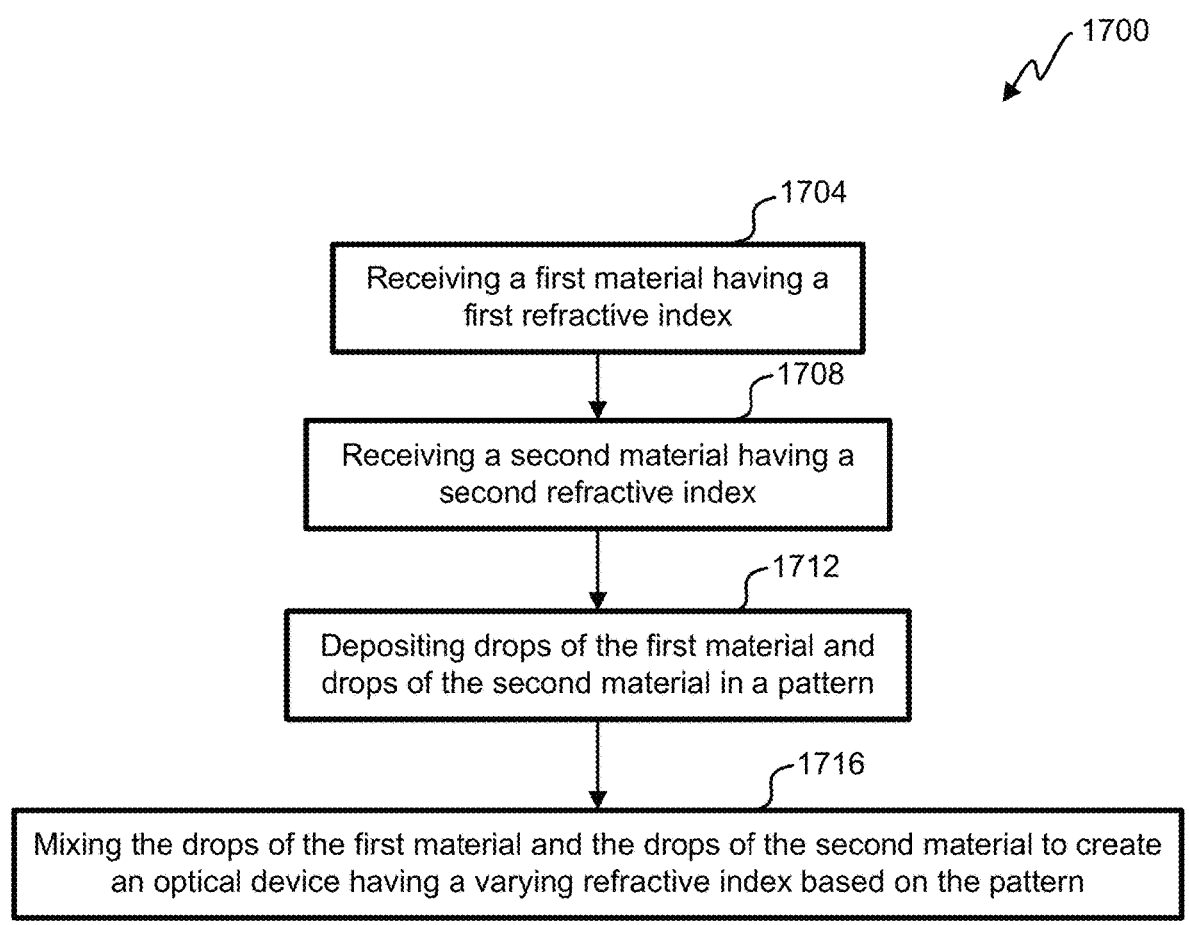
FIG. 17 illustrates an embodiment of a flowchart of a process for creating an optical device having a variable index of refraction.

FIG. 17 illustrates an embodiment of a flowchart of a process 1700 for creating an optical device having a variable index of refraction. Process 1700 begins in step 1704 with receiving a first material having a first refractive index (e.g., first material 808). In step 1708, a second material having a second refractive index is received (e.g., second material 908). In some embodiments, the first material is a base resin and the second material is generated by doping the base resin. The first refractive index is less than the second refractive index. Drops of the first material and drops of the second material are deposited in a pattern on a structure, step 1712. In step 1716, the drops of the first material and the drops of the second material are mixed to create a layer on the structure having a variable refractive index based on the pattern. In some embodiments, the structure is a substrate (e.g., substrate 812); the structure is a grating (e.g., grating 1112 or grating 1412) and the layer is an overcoat (e.g., overcoat 1316 or overcoat 1616) to the grating; the layer has a first direction of increasing refractive index, the structure has a second direction of increasing refractive index, and the first direction is opposite the second direction; and/or drops of the first material and/or drops of the second material have a diameter equal to or greater than 10 μm and equal to or less than 80 μm.

In some embodiments, the process 1700 further comprises imprinting the layer to form an optical grating in the layer (e.g., FIG. 10); performing a planarization of the layer (e.g., FIG. 12, FIG. 15); removing a substrate, the grating, and/or the overcoat from a mold (e.g., FIG. 13, FIG. 16); designing the pattern to reduce a residual layer; generating the first material and/or the second material by doping a resin with a sol-gel precursor, a monomer containing a reactive functional group, and/or nanoparticles; wherein the sol-gel precursor is titanium butoxide; the monomer is acrylic acid; and/or the nanoparticles are $TiO_2$, GaP, and/or $HfO_2$.

Figure 18:
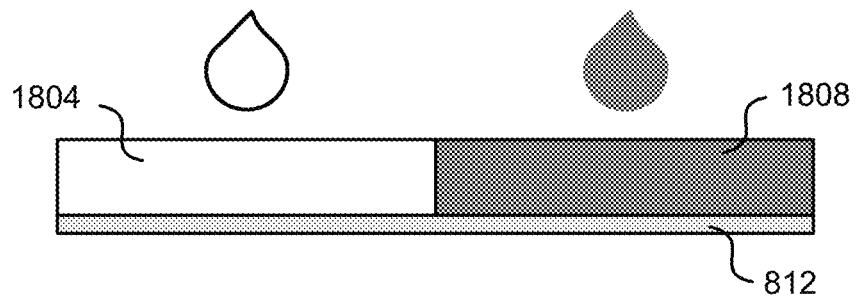
FIG. 18 is a simplified diagram of a side view of two resins that do not mix deposited on a substrate.

FIG. 18 is s simplified diagram of a side view of depositing two resins that do not mix to create a gradient. A first resin 1804 and a second resin 1808 are deposited onto the substrate 812.

The first resin 1804 has an initial refractive index and a delta index. The initial refractive index is a value of an index of refraction of the first resin 1804 before exposing the first resin 1804 to an energy gradient. In some embodiments, the initial refractive index of the first resin 1804 is between 1.2 and 1.6 (e.g., 1.4). The delta index of the first resin 1804 is a variation in refractive index that the first resin 1804 can take by exposure to the energy gradient. In some embodiments, the delta index of the first resin 1804 is between 0.2 and 0.4 (e.g., 0.3).

The second resin 1808 has an initial refractive index and a delta index. The initial refractive index of the second resin 1808 is a value of an index of refraction of the second resin 1808 before exposing the second resin 1808 to the energy gradient. In some embodiments, the initial refractive index of the second resin 1808 is between 1.5 and 1.9 (e.g., 1.7). The delta index of the second resin 1808 is a variation in refractive index that the second resin 1808 can take by exposure to the energy gradient. In some embodiments, the delta index of the second resin 1808 is between 0.2 and 0.4 (e.g., 0.3).

Figure 19:
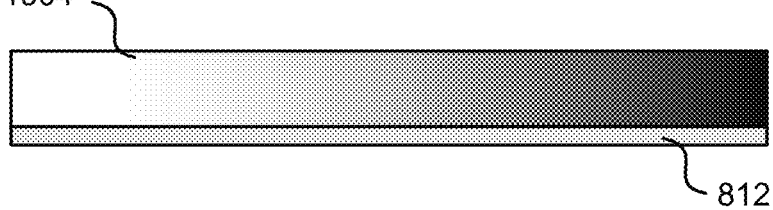
FIG. 19 is a refractive-index diagram of a side view of a refractive-index gradient using two non-mixing resins.

FIG. 19 is a simplified diagram of a side view of refractive index after creating a refractive-index gradient 1904 using the first resin 1804 and the second resin 1808 by exposing the first resin 1084 and/or the second resin 1808 to an energy gradient (e.g., a UV and/or thermal gradient). Though the first resin 1804 does not mix with the second resin 1808 (e.g., mixes relatively little), the refractive-index gradient 1904 is formed as a continuous gradient (e.g., by carefully controlling exposure to UV light and/or a thermal gradient). In some embodiments, the initial refractive index of the first resin 1804 is 1.4 and the delta index of the first resin 1804 is 0.3; and the initial refractive index of the second resin 1808 is 1.7 and the delta index of the second resin 1808 is 0.3. After exposing the first resin 1804 and the second resin 1808, the refractive-index gradient 1904 has an index ranging from 1.4 to 2.0, a delta index of 0.6.

Figure 20:
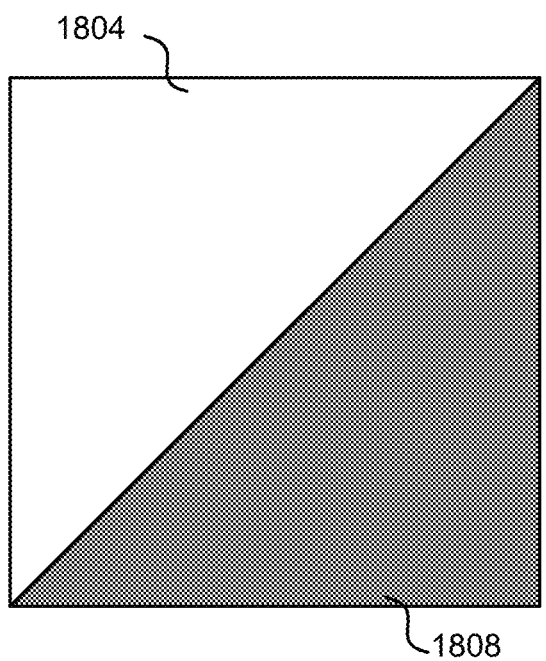
FIG. 20 is a simplified diagram of a top view of two resins deposited on a substrate.
Figure 21:
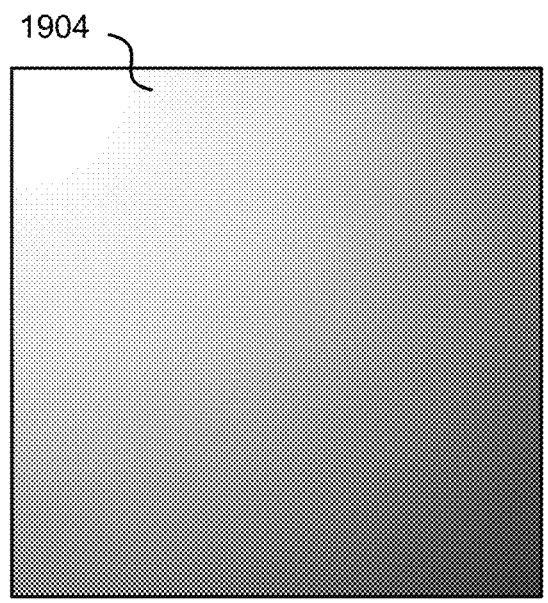
FIG. 21 is a refractive-index diagram of a top view of the two resins after exposure to an energy gradient.

FIG. 20 is a simplified diagram of a top view of an index profile of the first resin 1804 and the second resin 1808 before exposing the first resin 1804 and the second resin 1808 to the energy gradient. FIG. 21 is a simplified diagram of a top view of an index profile of the refractive-index gradient 1904. Other patterns can be made based on a precision of a machine applying resins and/or based on control of the energy gradient. For example, selected two-dimensional gradients and/or arbitrary two-dimensional gradients could be formed.

Figure 22:
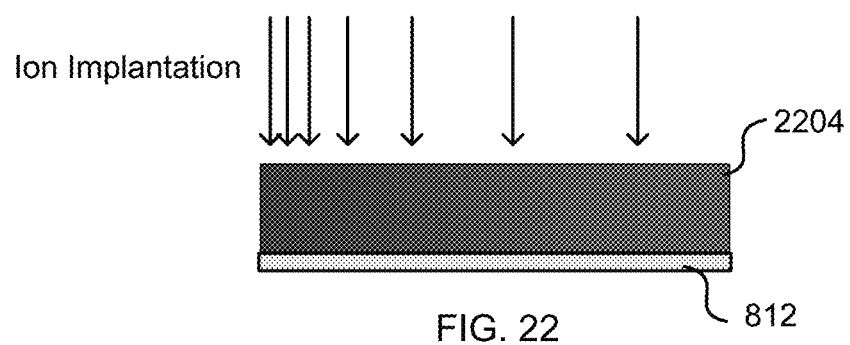
FIG. 22 is a simplified diagram of an embodiment of ion implantation.

FIG. 22 is a simplified diagram of an embodiment of ion implantation. A first material 2204 is deposited on the substrate 812. In some embodiments, the first material is $Si_3N_4$ and/or has a refractive index between 1.8 and 2.1 (e.g., 1.98). Ion implantation (e.g., using $O_2$ ions) is used to change a portion of the first material 2204 (e.g., $Si_3N_4$) into a second material (e.g., a silicon dioxide like material). The second material has a different refractive index than the first material. In some embodiments, the refractive index of the second material is lower than the refractive index of the first material (e.g., the refractive index of the second material is between 1.3 and 1.6; such as 1.46).

Figure 23:
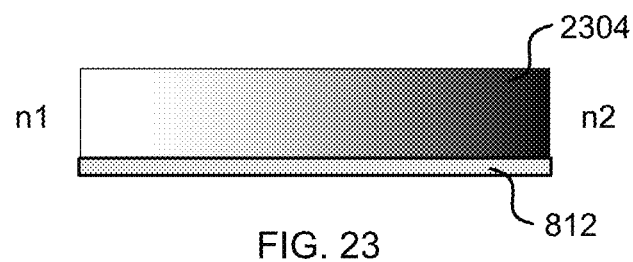
FIG. 23 is a simplified diagram of an embodiment of a layer having a variable refractive index after ion implantation.

FIG. 23 is a simplified diagram of an embodiment of a layer 2304 having a variable refractive index after ion implantation. By selectively applying the ion implantation, the layer 2304 having the variable refractive index is formed on the substrate 815. In the embodiment shown in FIG. 23, n1=1.46 and n2=1.98; a distance between the n1 and n2 is a few millimeters (e.g., between 2 mm and 20 mm; and/or between 3 mm and 7 mm). In some embodiments, a difference is refractive index is equal to or greater than 0.3, 0.4, or 0.5 and equal to or less than 0.6, 0.7, 0.8, 1.0 or 1.5.

Figure 24:
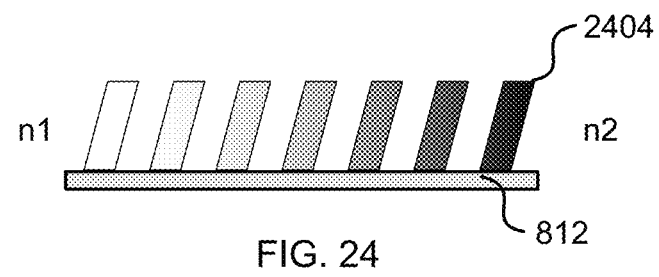
FIG. 24 is a simplified diagram of an embodiment of a grating with a variable refractive index, wherein the grating is formed after ion implantation.

FIG. 24 is a simplified diagram of an embodiment of a grating 2404 with a variable refractive index, wherein the grating 2404 is formed after ion implantation. In some embodiments, the grating 2404 is formed by imprint and/or etching (e.g., using photolithography).

Figure 25:
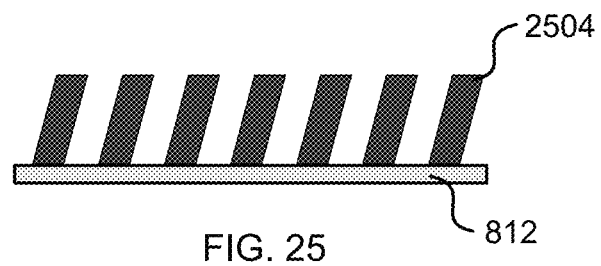
FIG. 25 is a simplified diagram of an embodiment of a prefabricated grating.

FIG. 25 is a simplified diagram of an embodiment of a prefabricated grating 2504. The prefabricated grating 2504 is formed by etching or imprint. The prefabricated grating 2504 is formed in a material (e.g., $Si_3N_4$). The material is on a substrate 812.

Figure 26:
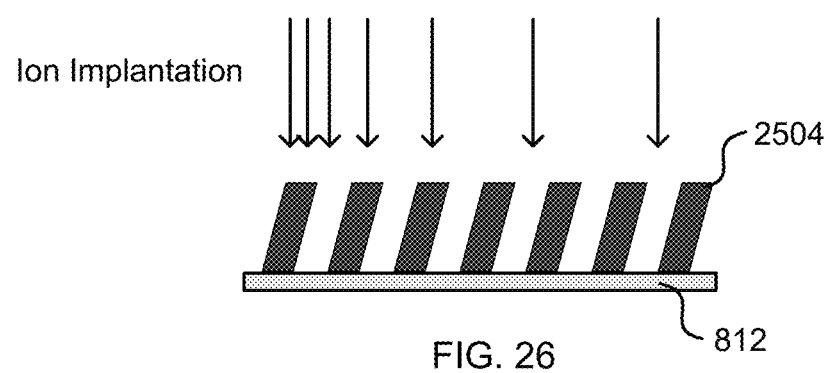
FIG. 26 is a simplified diagram of an embodiment of ion implantation of the prefabricated grating.

FIG. 26 is a simplified diagram of an embodiment of ion implantation of the prefabricated grating 2504. The prefabricated grating 2504 is provided and/or fabricated using imprint and/or etching. Ion implantation is similar to that discussed in conjunction with FIG. 22.

Figure 27:
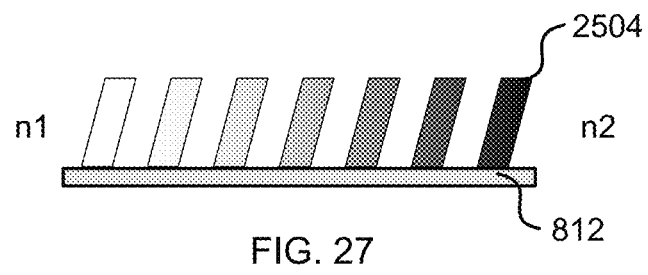
FIG. 27 is a simplified diagram of an embodiment of the prefabricated grating 2504 with a variable refractive index after ion implantation.

FIG. 27 is a simplified diagram of an embodiment of the prefabricated grating 2504 with a variable refractive index after ion implantation. In FIG. 27, n1 and n2 have similar values as n1 and n2 discussed in conjunction with FIG. 23. Thus structures can be formed and then index changed after fabrication. Using ion implantation, most any two-dimensional or three-dimensional index variation can be achieved. In some embodiments, sequential infiltration using gas clusters (e.g., TMA gas clusters) instead of individual atoms is used. In some embodiments solid state implantation (e.g., doping, such as atomic layer deposition (ALD)) or using a liquid precursor applied by an inkjet is used.

Figure 28:
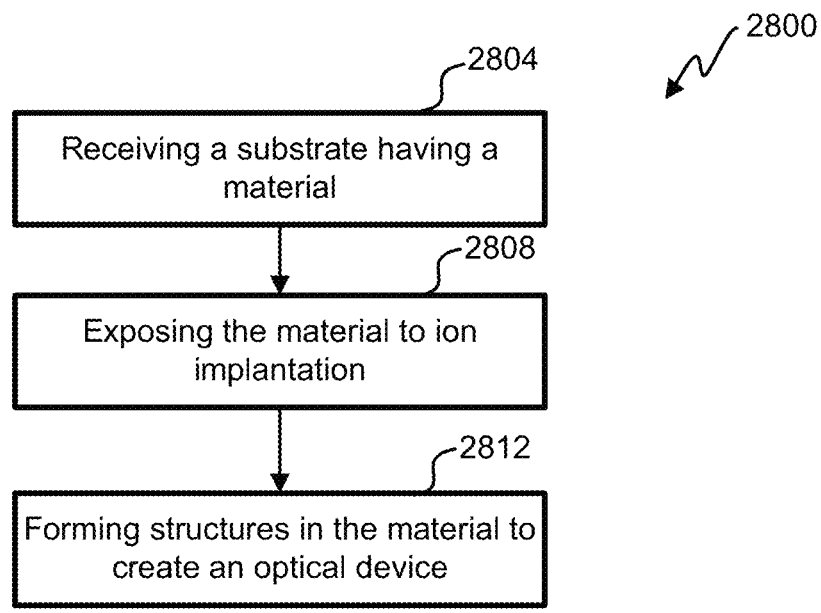
FIG. 28 illustrates an embodiment of a flowchart of a process using ion implantation for creating an optical device having a variable index of refraction.

FIG. 28 illustrates an embodiment of a flowchart of a process 2800 using ion implantation for creating an optical device having a variable index of refraction. Process 2800 begins in step 2804 with receiving a substrate (e.g., substrate 812) having a material. For example, the material is the first material in FIG. 22. In some embodiments, the material is part of the substrate. In some embodiments, the material is added to the substrate. In step 2808, the material is exposed to ion implantation (e.g., FIG. 22). In step 2812, structures (e.g., ridges and/or trenches to form a grating) are formed in the material to create an optical device. In some embodiments, the structures are formed using etching or implant (FIG. 24).

Figure 29:
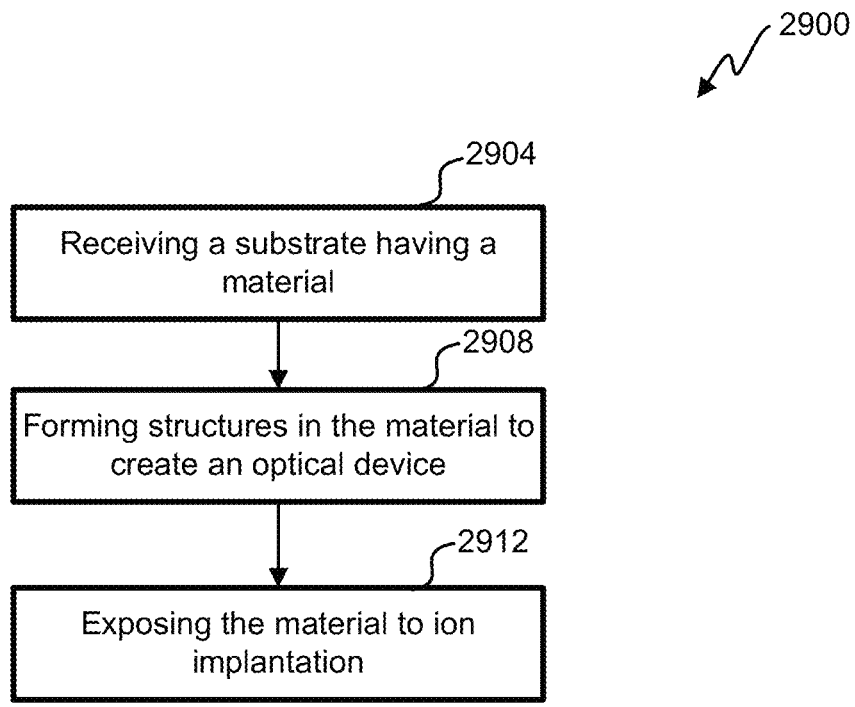
FIG. 29 illustrates another embodiment of a flowchart of a process using ion implantation for creating an optical device having a variable index of refraction.

FIG. 29 illustrates another embodiment of a flowchart of a process 2900 using ion implantation for creating an optical device having a variable index of refraction. Process 2900 begins in step 2904 with receiving a substrate (e.g., substrate 812) having a material. For example, the material is the material in FIG. 25. In some embodiments, the material is part of the substrate. In some embodiments, the material is added to the substrate. In step 2908, structures are formed in the material to create an optical device (e.g., structures forming a grating for an output coupler of a waveguide of a near-eye display). In some embodiments, the structures are formed using etching or implant. In step 2812, the material is exposed to ion implantation after the structures are formed.

In some embodiments, the ion implant is non-uniform. For example, the ion implantation varies as a function of x, y, and/or z, wherein the z direction is the direction of ion implantation. The ion implantation follows a smooth function. In some embodiments, the smooth function is a gradient, wherein refractive index along an axis continuously increases or decreases. An overcoat can be added to the structures. For example, the overcoat 1616 in FIG. 16, which has a varying refractive index and/or wherein the refractive index of the overcoat is in an opposite direction as the refractive index of the structures. The refractive index of the structure can vary in two dimensions (e.g., as described with FIG. 7); and the refractive index can vary in a third dimension (e.g., z direction) by varying ion implantation energy.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method comprising:
    receiving a substrate having a material disposed on the substrate;
    exposing the material to ion implantation, wherein:
        the ion implantation is non-uniform, and
        the ion implantation forms a varying refractive index in different regions of the material; and
    etching or imprinting the material to form structures in the material to create an optical device that includes a plurality of ridges and a plurality of grooves,
    wherein a first ridge of the plurality of ridges in a first region of the optical device and a second ridge of the plurality of ridges in a second region of the optical device have different refractive indices.

2. The method of claim 1, wherein the optical device is a grating.

3. The method of claim 1, wherein exposing the material to ion implantation is performed before etching or imprinting the material.

4. The method of claim 1, wherein etching or imprinting the material is performed before exposing the material to ion implantation.

5. The method of claim 1, wherein the non-uniform ion implantation follows a smooth function.

6. The method of claim 5, wherein the smooth function is continuously increasing or decreasing to form a gradient.

7. The method of claim 1, further comprising applying an overcoat to the structures in the material.

8. The method of claim 7, wherein the overcoat is characterized by a varying refractive index.

9. The method of claim 8, wherein the overcoat has a refractive index gradient in an opposite direction as a refractive index gradient of the material.

10. The method of claim 7, wherein the ion implantation varies in three dimensions.

11. An optical device comprising:
    a substrate;
    a material disposed on the substrate;
    a plurality of ridges and a plurality of grooves formed in the material; and
    a varying refractive index in the material created by ion implantation,
    wherein a first ridge of the plurality of ridges in a first region of the optical device and a second ridge of the plurality of ridges in a second region of the optical device have different refractive indices.

12. The optical device of claim 11, wherein a maximum refractive index of the material minus a minimum refractive index of the material is equal to or greater than 0.5 and/or equal to or less than 1.0.

13. The optical device of claim 11, wherein the plurality of ridges and the plurality of grooves are part of a grating.

14. The optical device of claim 11, further comprising an overcoat on the material.

15. The optical device of claim 14, wherein:
    the overcoat has a first direction of increasing refractive index;
    the material has a second direction of increasing refractive index; and
    the first direction is opposite the second direction.

16. The optical device of claim 11, wherein the material has an index of refraction that varies in two dimensions.

17. The optical device of claim 11, wherein the material has an index of refraction that varies in three dimensions.

18. A system comprising:
    an optical source for an augmented-reality display;
    a waveguide;
    an input coupler configured to couple light from the optical source into the waveguide; and
    an output coupler configured to couple light out of the waveguide, the output coupler comprising:
        a substrate;

a material disposed on the substrate, wherein the material has a varying refractive index created by ion implantation; and a plurality of ridges and a plurality of grooves formed in the material, wherein a first ridge of the plurality of ridges in a first region of the output coupler and a second ridge of the plurality of ridges in a second region of the output coupler have different refractive indices.

19. The system as recited in claim 18, wherein the plurality of ridges and the plurality of grooves are part of a grating.

20. The system as recited in claim 18, wherein the varying refractive index varies in two dimensions.

* * * * *